(12) United States Patent
Chen et al.

(10) Patent No.: US 9,953,982 B1
(45) Date of Patent: Apr. 24, 2018

(54) SEMICONDUCTOR DEVICE AND METHOD FOR FABRICATING THE SAME

(71) Applicants: UNITED MICROELECTRONICS CORP., Hsin-Chu (TW); Fujian Jinhua Integrated Circuit Co., Ltd., Quanzhou, Fujian province (CN)

(72) Inventors: Pin-Hong Chen, Tainan (TW); Tsun-Min Cheng, Changhua County (TW); Chih-Chieh Tsai, Kaohsiung (TW); Tzu-Chieh Chen, Pingtung County (TW); Kai-Jiun Chang, Taoyuan (TW); Chia-Chen Wu, Nantou County (TW); Yi-An Huang, New Taipei (TW); Yi-Wei Chen, Taichung (TW)

(73) Assignees: UNITED MICROELECTRONICS CORP., Hsin-Chu (TW); Fujian Jinhua Integrated Circuit Co., Ltd., Quanzhou, Fujian province (CN)

( * ) Notice: Subject to any disclaimer, the term of this patent is extended or adjusted under 35 U.S.C. 154(b) by 0 days.

(21) Appl. No.: 15/468,084

(22) Filed: Mar. 23, 2017

(30) Foreign Application Priority Data

Feb. 20, 2017 (CN) .......................... 2017 1 0090300

(51) Int. Cl.
| | |
|---|---|
| *H01L 27/108* | (2006.01) |
| *H01L 29/06* | (2006.01) |
| *H01L 21/762* | (2006.01) |
| *H01L 21/311* | (2006.01) |
| *H01L 21/28* | (2006.01) |
| *H01L 29/423* | (2006.01) |
| *H01L 21/033* | (2006.01) |

(52) U.S. Cl.
CPC .... *H01L 27/10823* (2013.01); *H01L 21/0332* (2013.01); *H01L 21/28008* (2013.01); *H01L 21/31144* (2013.01); *H01L 21/76224* (2013.01); *H01L 27/10876* (2013.01); *H01L 29/0649* (2013.01); *H01L 29/4236* (2013.01)

(58) Field of Classification Search
CPC ........... H01L 21/0332; H01L 21/28008; H01L 21/31144; H01L 21/76224; H01L 27/10823; H01L 29/0649; H01L 29/4236
See application file for complete search history.

(56) References Cited

U.S. PATENT DOCUMENTS

| | | | |
|---|---|---|---|
| 8,435,847 B2 | 5/2013 | Chun | |
| 2008/0121990 A1* | 5/2008 | Hasunuma | H01L 27/10876 257/333 |
| 2011/0165747 A1* | 7/2011 | Kim | H01L 27/10876 438/270 |
| 2012/0153369 A1* | 6/2012 | Hwang | H01L 27/10894 257/296 |
| 2012/0280310 A1* | 11/2012 | Han | H01L 21/76224 257/330 |

(Continued)

*Primary Examiner* — Christine Enad
(74) *Attorney, Agent, or Firm* — Winston Hsu

(57) ABSTRACT

A method for fabricating semiconductor device includes the steps of: forming a shallow trench isolation (STI) in a substrate; removing part of the STI to form a first trench; forming a cap layer in the first trench; forming a mask layer on the cap layer and the substrate; and removing part of the mask layer, part of the cap layer, and part of the STI to form a second trench.

11 Claims, 5 Drawing Sheets

(56) References Cited

U.S. PATENT DOCUMENTS

| | | | |
|---|---|---|---|
| 2014/0120691 A1* | 5/2014 | Lee | H01L 21/76 438/400 |
| 2015/0014807 A1* | 1/2015 | Chuang | H01L 29/0649 257/506 |
| 2015/0035022 A1* | 2/2015 | Chung | H01L 21/76224 257/288 |
| 2016/0197084 A1* | 7/2016 | Yoon | H01L 27/10876 438/270 |

\* cited by examiner

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly to a method for fabricating a dynamic random access memory (DRAM) device.

2. Description of the Prior Art

As electronic products develop toward the direction of miniaturization, the design of dynamic random access memory (DRAM) units also moves toward the direction of higher integration and higher density. Since the nature of a DRAM unit with buried gate structures has the advantage of possessing longer carrier channel length within a semiconductor substrate thereby reducing capacitor leakage, it has been gradually used to replace conventional DRAM unit with planar gate structures.

Typically, a DRAM unit with buried gate structure includes a transistor device and a charge storage element to receive electrical signals from bit lines and word lines. Nevertheless, current DRAM units with buried gate structures still pose numerous problems due to limited fabrication capability. Hence, how to effectively improve the performance and reliability of current DRAM device has become an important task in this field.

SUMMARY OF THE INVENTION

According to an embodiment of the present invention, a method for fabricating semiconductor device includes the steps of: forming a shallow trench isolation (STI) in a substrate; removing part of the STI to forma first trench; forming a cap layer in the first trench; forming a mask layer on the cap layer and the substrate; and removing part of the mask layer, part of the cap layer, and part of the STI to form a second trench.

According to another aspect of the present invention, a semiconductor device includes: a shallow trench isolation (STI) in a substrate; a cap layer on the STI; and a first gate electrode in the cap layer and the STI.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
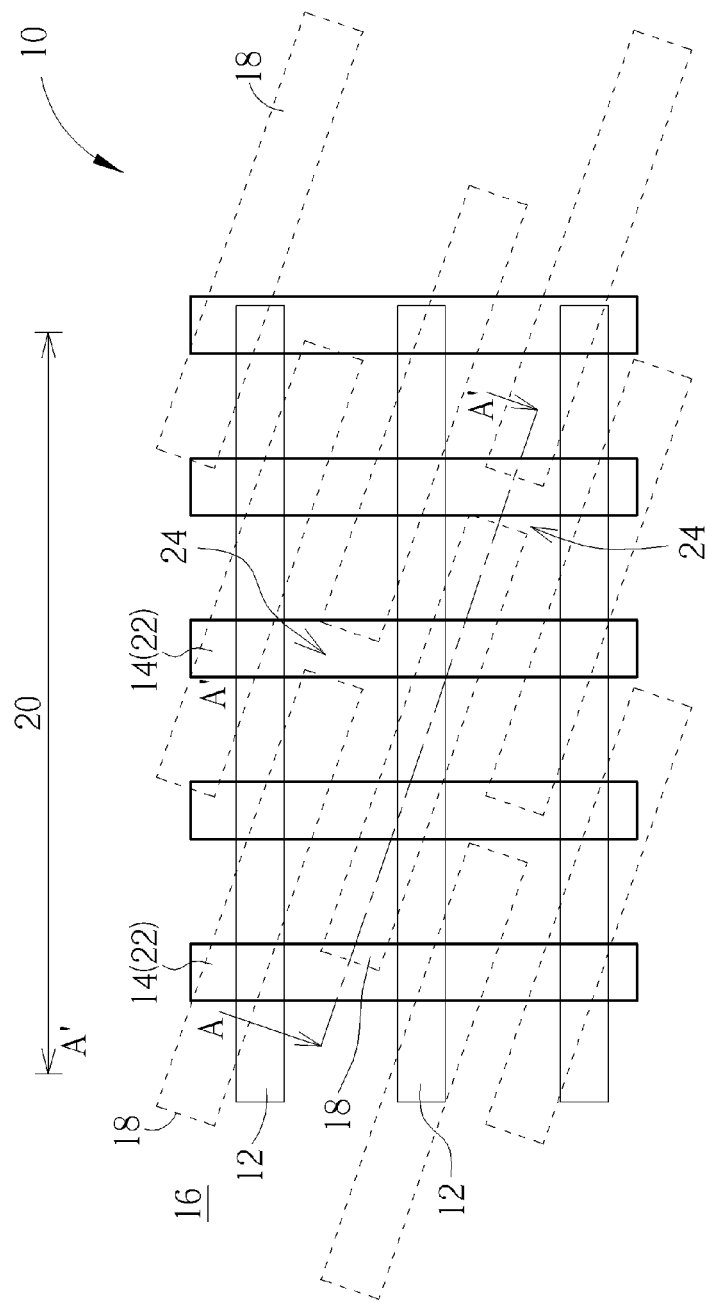
FIGS. 1-9 illustrate a method for fabricating a DRAM device according to a preferred embodiment of the present invention.

Referring to FIGS. 1-9, FIGS. 1-9 illustrate a method for fabricating a DRAM device according to a preferred embodiment of the present invention, in which FIG. 1 illustrates a top-view diagram and FIGS. 2-9 illustrate cross-sectional views of FIG. 1 along the sectional line AA'. Preferably, the present embodiment pertains to fabricate a memory device, and more particularly a DRAM device 10, in which the DRAM device 10 includes at least a transistor device (not shown) and at least a capacitor structure (not shown) that will be serving as a smallest constituent unit within the DRAM array and also used to receive electrical signals from bit lines 12 and word lines 14.

As shown in FIG. 1, the DRAM device 10 includes a substrate 16 such as a semiconductor substrate or wafer made of silicon, a shallow trench isolation (STI) 24 formed in the substrate 16, and a plurality of active areas (AA) 18 defined on the substrate 16. A memory region 20 and a periphery region (not shown) are also defined on the substrate 16, in which multiple word lines 14 and multiple bit lines 12 are preferably formed on the memory region 20 while other active devices (not shown) could be formed on the periphery region. For simplicity purpose, only devices or elements on the memory region 20 are shown in FIG. 1 while elements on the periphery region are omitted.

In this embodiment, the active regions 18 are disposed parallel to each other and extending along a first direction, the word lines 14 or multiple gates 22 are disposed within the substrate 16 and passing through the active regions 18 and STIs 24. Preferably, the gates 22 are disposed extending along a second direction, in which the second direction crosses with the first direction at an angle less than 90 degrees.

The bit lines 12 on the other hand are disposed on the substrate 16 parallel to each other and extending along a third direction while crossing the active regions 18 and STI 24, in which the third direction is different from the first direction and orthogonal to the second direction. In other words, the first direction, second direction, and third direction are all different from each other while the first direction is not orthogonal to both the second direction and the third direction. Preferably, contact plugs such as bit line contacts (BLC) (not shown) are formed in the active regions 18 adjacent to two sides of the word lines 14 to electrically connect to source/drain region (not shown) of each transistor element and storage node contacts (not shown) are formed to electrically connect to a capacitor.

Figure 2:
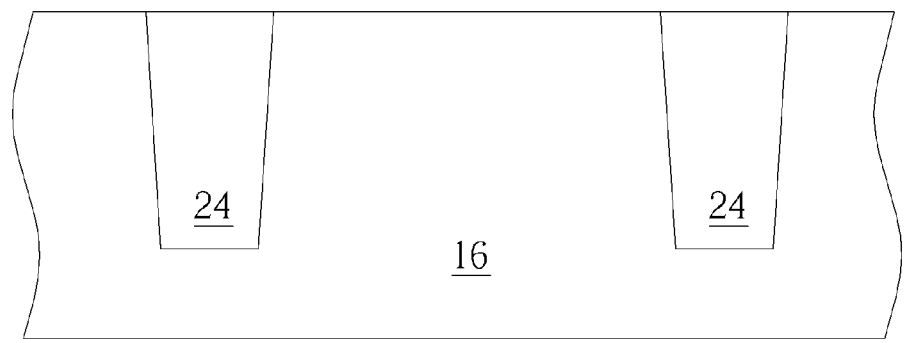
Figure 3:
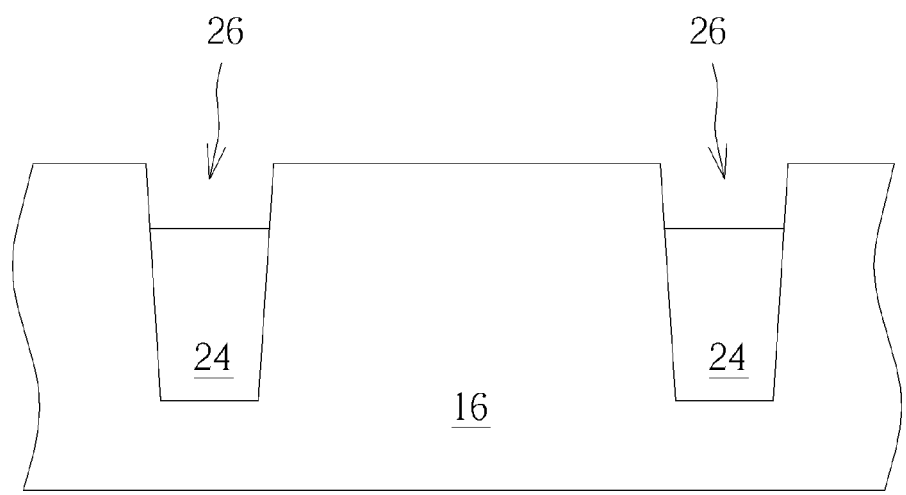

The fabrication of word lines 14 (or also referred to as buried word lines) is explained below. As shown in FIG. 2, a STI 24 is formed in the substrate 16, and then as shown in FIG. 3, an etching process is conducted by using the etching selectivity between the substrate 16 and STI 24 to remove part of the STI 24 for forming first trenches 26. In this embodiment, the etching process conducted to remove part of the STI 24 preferably includes a chemical oxide removal (COR) or SiCoNi, process, in which gases including but not limited to for example $NF_3$, $NH_3$, or combination thereof could be used to remove part of the STI 24 made preferably of silicon dioxide. It is to be noted that the SiCoNi process is commonly conducted by reacting fluorine-containing gas with silicon oxide to form $((NH_4)_2SiF_6)$ thereby removing native oxide, in which the fluorine-containing gas could include HF or $NF_3$.

It should further be noted that since the etching target of the gas such as $NF_3$ and/or $NH_3$ used in this embodiment is silicon dioxide, the substrate 16 made of silicon is preferably not etched or lost at all during the etching process. In this embodiment, the height or depth of the first trench 26 measured from the top surface of the remaining STI 24 to the surface of the substrate 16 is between 40 Angstroms to 60 Angstroms or more preferably at 50 Angstroms.

Figure 4:
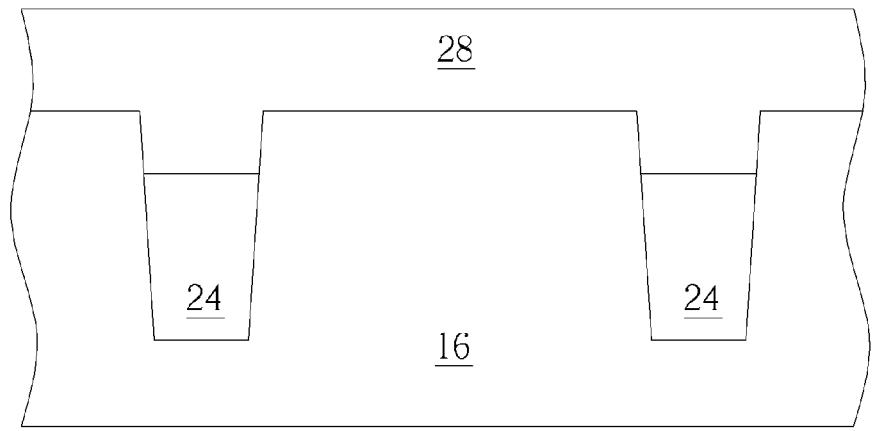

Next, as shown in FIG. 4, a cap layer 28 is formed into the first trenches 26, in which the cap layer 28 not only fills the first trenches 26 completely but also disposed on the surface of the substrate 16. In this embodiment, the cap layer 28 and the STI 24 are preferably made of different material, in which the cap layer 28 could include silicon nitride (SiN), silicon carbon nitride (SiCN), silicon oxycarbonitride (SiOCN), or amorphous silicon.

Figure 5:
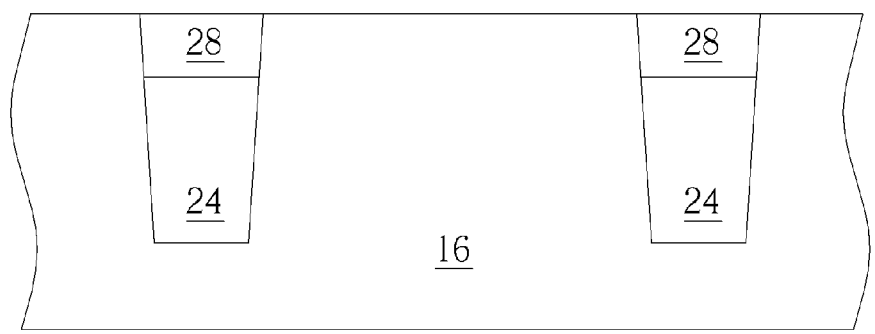

Next, as shown in FIG. 5, a planarizing process such as chemical mechanical polishing (CMP) process is conducted or an etching back process could be conducted to remove part of the cap layer 28 and even part of the substrate 16 so that the top surface of the remaining cap layer 28 is even with the substrate 16 surface. In this embodiment, the height of the remaining cap layer 28 is about one third of the distance measured from the bottom of the STI 24 to the surface of the substrate 16. Preferably, the height of the remaining cap layer 28 in this embodiment is about 40 Angstroms to 60 Angstroms or most preferably at 50 Angstroms.

Figure 6:
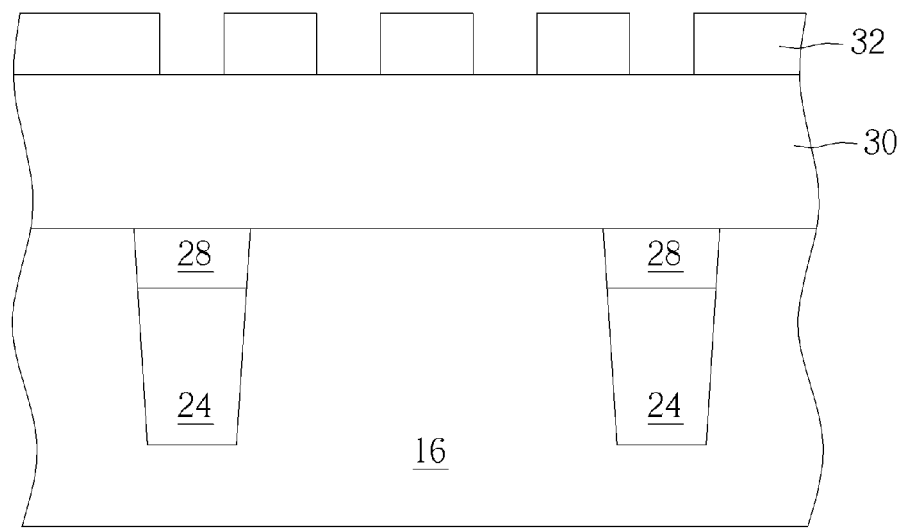

Next, as shown in FIG. 6, a mask layer 30 is formed on the cap layer 28 and on the substrate 16, and a patterned mask such as a patterned resist 32 is formed on the mask layer 30 to expose part of the surface of the mask layer 30. In this embodiment, the mask layer 30 preferably includes amorphous carbon film (APF), but not limited thereto.

Figure 7:
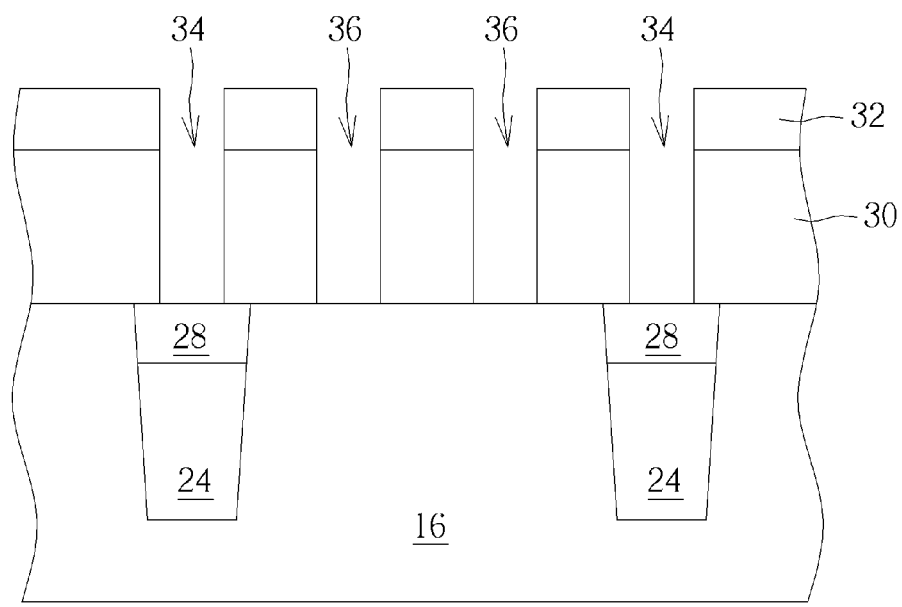

Next, as shown in FIG. 7, an etching process is conducted by using the patterned resist 32 as mask to remove part of the mask layer 30 for forming trenches 34 and 36 at the same time, in which the trenches 34 expose part of the cap layer 28 surface and trenches 36 expose the substrate 16 surface.

Figure 8:
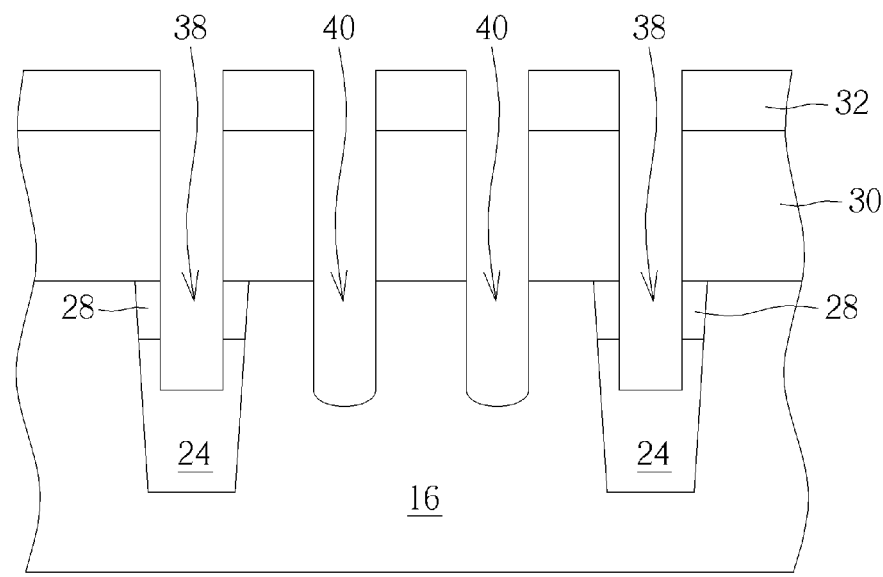

Next, as shown in FIG. 8, etching process is continued by using the patterned resist 32 as mask to remove part of the cap layer 28 and part of the STI 24 directly under the trenches 34 and part of the substrate 16 directly under the trenches 36 at the same time. This forms second trenches 38 exposing the top surface of STI 24 and sidewalls of the cap layer 28 and third trenches 40 exposing the surface of substrate 16 adjacent to the STI 24. It should be noted that since the STI 24 and the substrate 16 are made of different material thereby having different etching selectivity, the bottom surfaces of the second trenches 38 and the third trenches 40 preferably form different surface profile after the etching process is conducted to remove part of the STI 24 and part of the substrate 16. More specifically, a bottom surface of the second trenches 38 in this embodiment include a planar surface while a bottom surface of the third trenches 40 include a curved surface.

Figure 9:
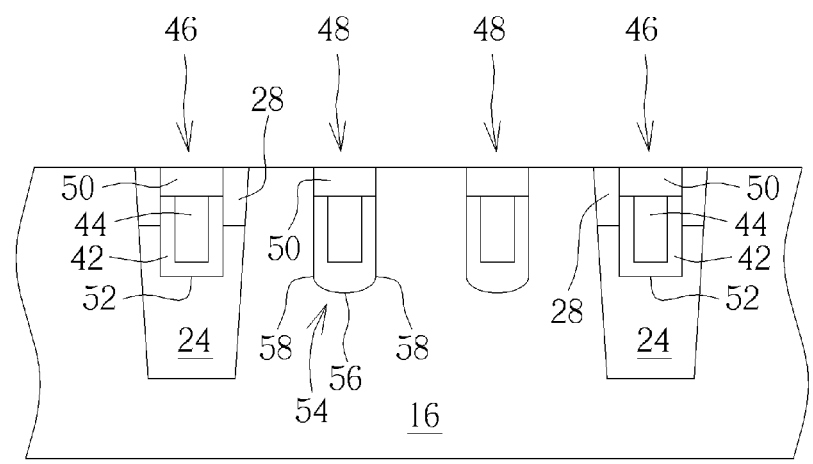

Next, as shown in FIG. 9, the patterned resist 32 and mask layer 30 are removed completely, and a selective dielectric layer (not shown), a selective barrier layer 42, and a conductive layer 44 are deposited into the second trenches 38 and third trenches 40. Next, a planarizing process such as CMP process is conducted to remove part of the conductive layer 44 and part of the barrier layer 42 to form first gate electrodes 46 in the second trenches 38 and second gate electrodes 48 in the third trenches 40. In this embodiment, the dielectric layer preferably includes silicon oxide, the barrier layer 42 preferably includes TiN, and the conductive layer 44 includes tungsten (W), but not limited thereto. Next, part of the conductive layer 44 and part of the barrier layer 42 could be removed to form recesses (not shown), and hard masks 50 made of dielectric material such as silicon nitride are disposed into the recesses so that the top surfaces of the hard masks 50 and substrate 16 are coplanar. This completes the fabrication of buried word lines according to a preferred embodiment of the present invention.

Next, ion implantation process could be conducted depending on the demand of the product to form doped regions (not shown) such as lightly doped drains (LDDs) or source/drain regions in the substrate 16 adjacent to two sides of the first gate electrodes 46 and/or second gate electrodes 48. Next, contact plug formation could be conducted to form bit line contact plugs adjacent to two sides of the second gate electrodes 48 for electrically connecting the source/drain region and bit lines formed afterwards as well as storage node contact plugs for electrically connecting the source/drain region and capacitor formed afterwards.

Referring again to FIG. 9, FIG. 9 further illustrates a structural view of a semiconductor device according to an embodiment of the present invention. As shown in FIG. 9, the semiconductor device includes STIs 24 disposed in the substrate 16, cap layers 28 disposed on the STIs 24, first gate electrodes 46 disposed in the cap layer 28 and STIs 24 while surrounded by the cap layers 28 and STIs 24 at the same time, and second gate electrodes 48 disposed in the substrate 16 adjacent to the first gate electrodes 46.

In this embodiment, a selective hard mask 50 is disposed on each of the first gate electrodes 46 and second gate electrodes 48, in which the top surfaces of the first gate electrodes 46 and second gate electrodes 48 are coplanar and the top surfaces of the hard masks 50 atop the first gate electrodes 46 and the hard masks 50 atop the second gate electrodes 48 are also coplanar. It should be noted that even though the bottom surface of the hard mask 50 on top of the first gate electrode 46 is higher than the bottom surface of the adjacent cap layer 28, it would also be desirable to adjust the height of the conductive layer 44 and barrier layer 42 so that the bottom surface of the hard mask 50 is even with or lower than the bottom surface of the adjacent cap layer 28, which are all within the scope of the present invention.

It should also be noted that the bottom surface of the first gate electrodes 46 and the bottom surface of the second gate electrodes 48 preferably include different surface profiles, in which the bottom of the first gate electrode 46 include a planar surface 52 while the bottom of the second gate electrode 48 includes a curved surface 54. Viewing from a more detailed perspective, the curved surface 54 on the bottom of the second gate electrode 48 also includes a valley point 56 and two peak points 58, in which the planar surface 52 is preferably aligned with the two peak points 58 on a horizontal plane or X-axis. In other words, the valley point 56 is slightly lower than the planar surface 52.

In this embodiment, the substrate 16, STI 24, and cap layer 28 are preferably made of different material, in which the cap layer 28 and hard mask 50 could be made of same material or different material. Preferably, the substrate 16 is made of silicon, the STI 24 is made of silicon oxide, the cap layer 28 preferably includes SiN, SiCN, SiCON, or amorphous silicon, and the hard mask 50 preferably includes SiN.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   forming a shallow trench isolation (STI) in a substrate;
   removing part of the STI to form a first trench;
   forming a cap layer in the first trench, wherein a top surface of the cap layer is even with a top surface of the substrate;
   forming a mask layer on and directly contacting the cap layer and the substrate; and
   removing part of the mask layer, part of the cap layer, and part of the STI to form a second trench and removing part of the mask layer and part of the substrate without removing the cap layer to form a third trench at the same time, wherein a bottom surface of the third trench is lower than a bottom surface of the second trench.

2. The method of claim 1, further comprising:
forming the cap layer in the first trench and on the substrate; and
removing part of the cap layer so that the top surfaces of the cap layer and the substrate are coplanar.

3. The method of claim 1, wherein a bottom surface of the second trench comprises a planar surface and a bottom surface of the third trench comprises a curved surface.

4. The method of claim 1, further comprising:
removing the mask layer after forming the second trench and the third trench;
forming a conductive layer in the second trench and the third trench; and
removing part of the conductive layer to form a first gate electrode in the second trench and a second gate electrode in the third trench.

5. The method of claim 4, wherein the top surfaces of the first gate electrode and the cap layer are coplanar.

6. The method of claim 4, wherein the top surfaces of the first gate electrode and the second gate electrode are coplanar.

7. The method of claim 1, wherein the mask layer comprises amorphous carbon film (APF).

8. The method of claim 1, wherein the cap layer comprises SiN, SiCN, SiOCN, or amorphous silicon.

9. A semiconductor device, comprising:
a shallow trench isolation (STI) in a substrate;
a cap layer on the STI;
a first gate electrode in the cap layer and the STI;
a second gate electrode in the substrate, wherein the top surfaces of the first gate electrode and the second gate electrode are coplanar, a bottom surface of the first gate electrode is higher than a bottom surface of the second gate electrode, the bottom surface of the first gate electrode comprises a planar surface, and the bottom surface of the second gate electrode comprises a curved surface; and
a hard mask on each of the first gate electrode and the second gate electrode, wherein a top surface of the first gate electrode is higher than a top surface of the STI.

10. The semiconductor device of claim 9, wherein the top surfaces of the hard mask and the cap layer are coplanar.

11. The semiconductor device of claim 9, wherein the cap layer comprises SiN, SiCN, SiOCN, or amorphous silicon.

* * * * *